United States Patent [19]

Davis et al.

[11] 3,868,770

[45] Mar. 4, 1975

[54] WELDED INTERCONNECTION PRINTED CIRCUIT BOARD AND METHOD OF MAKING SAME

[75] Inventors: Herbert T. Davis, Tempe; James B. Reid, Phoenix, both of Ariz.

[73] Assignee: Motorola, Inc., Franklin Park, Ill.

[22] Filed: July 23, 1973

[21] Appl. No.: 381,826

Related U.S. Application Data

[62] Division of Ser. No. 249,044, May 1, 1972.

[52] U.S. Cl. .......................... 29/626, 29/626, 29/628, 174/68.5, 317/101 B, 317/101 CC

[51] Int. Cl. .............................................. H05k 3/32

[58] Field of Search ............. 29/625, 624, 626, 628; 174/68.5; 317/101 C, 101 CC, 101 CM, 101 B; 339/17 R, 17 B, 17 C

[56] References Cited

UNITED STATES PATENTS

| | | | |
|---|---|---|---|
| 2,974,284 | 3/1961 | Parker | 174/68.5 X |
| 3,098,951 | 7/1963 | Ayer et al. | 29/626 X |
| 3,151,278 | 9/1964 | Elarde | 29/626 UX |
| 3,176,381 | 4/1965 | Elarde | 29/625 |
| 3,200,020 | 8/1965 | Schroeder | 29/625 X |
| 3,290,557 | 12/1966 | Ayer | 174/68.5 X |
| 3,315,133 | 4/1967 | Walker | 174/68.5 X |
| 3,342,927 | 9/1967 | Kubik et al. | 29/625 X |
| 3,372,474 | 3/1968 | Polley et al. | 174/68.5 X |
| 3,437,882 | 4/1969 | Cayzer | 317/101 CM |
| 3,470,612 | 10/1969 | Helms | 174/68.5 X |
| 3,546,539 | 12/1970 | Wilcox, Jr. et al. | 174/68.5 X |

*Primary Examiner*—Richard J. Herbst
*Assistant Examiner*—Joseph A. Walkowski
*Attorney, Agent, or Firm*—Vincent J. Rauner; Sang Ki Lee

[57] ABSTRACT

An all-welded interconnection printed circuit board and method of making it is disclosed wherein a fiberglass sheet or other dielectric film impregnated with a stage B epoxy or other polymer resin with prepunched holes is placed between two thin sheets of nickel for example, and spot welds made through the prepunched holes. The assembly is thus held together and placed in a curing press where under prescribed temperature and pressure for a prescribed time stage B epoxy resin is cured to form a laminated structure of two metal layers separated by a dielectric layer. During the curing step, the epoxy resin flows around the spot welds and seals them off from the effects of etching solutions. By using printed circuit masking and etching techniques, strip circuits are formed on each side of the board. Adjacent the spot welds, holes are punched in the dielectric layer followed by resistance spot welding a lead tab to each area of a spot weld in one side of the board. Electric components, such as resistors, capacitors, or the like, have leads of sufficient length to project through the holes from the opposite side of the board which leads are resistance spot welded to the lead tabs at their outer ends. Components are removed, if desired, by cutting the lead tabs and the component leads adjacent the outer ends. New components have leads which are then welded to outer ends of the shortened lead tabs.

Where additional support is needed, a further layer of fiberglass impregnated with stage B "no-flow" or "low flow" epoxy resin is bonded to the cured dielectric/etched nickel laminate in the same manner. Before such bonding, holes are formed as by punching in the support layer at the same locations as the spot welds in the metallic sheets. After bonding, holes are punched through adjacent both bonded dielectric layers, and lead tabs are welded to the previously formed spot welds at one side of the board. Components may then be attached from the other side of the board as described.

Metal-dielectric-metal assemblies, or sandwiches, already formed may be bonded together with further fiberglass layers impregnated with stage B epoxy resin to form multilayered boards. Lead tabs and components would be attached as described.

19 Claims, 17 Drawing Figures

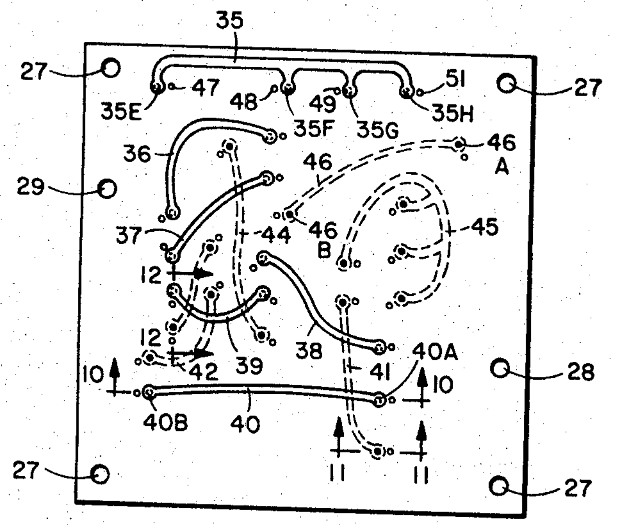
Fig. 9
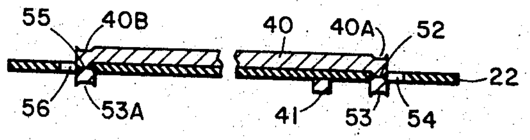
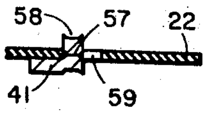
Fig. 10 Fig. 11
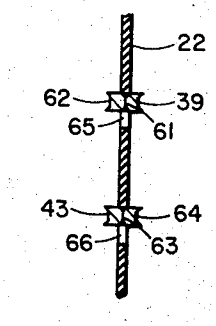
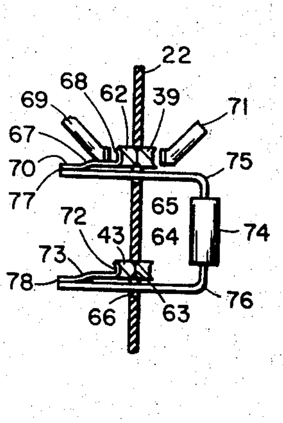
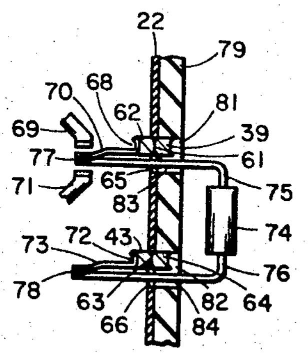
Fig. 12 Fig. 13 Fig. 14

WELDED INTERCONNECTION PRINTED CIRCUIT BOARD AND METHOD OF MAKING SAME

This is a division of application Ser. No. 249,044 filed May 1, 1972.

BACKGROUND OF THE INVENTION

This invention relates to welded interconnection printer circuit boards and methods of making the same, and it is an object of the invention to provide improved printed circuit boards and methods of making of this nature.

Printed circuit interconnecting boards are known, but these have usually involved metal conducting strips of copper or aluminum. Connections to these conducting strips have usually been by soldering utilizing lead-tin solder, or the like. Such connections have not been entirely satisfactory for several reasons. Among these are the high fatigue failure rates of solder connections, the need for soldering flux and consequent need of excess flux removal both in the original installation and in the replacement of components, and the exposure of circuit parts or componets to soldering temperatures. It is a further object of the invention to provide printed circuit interconnect boards of the nature indicated which are free of the stated and other defects of the prior art.

While efforts have been made to electrically resistance weld aluminum or copper, this has been done, if at all, only with great difficulty because the heat conductivity of these metals is too high, and yet copper is one of the most commonly used metals in printed circuits.

In space travel apparatus the need for high and long-term reliability is axiomatic and in any application wherein a component replacement capability and high strength are required, solder joints are not the best answer. High reliability and high strength joints may be achieved by electrical resistance welding, both article and method, according to the invention. Likewise, high component replaceability and avoidance of subjecting either the board or the components to high temperatures of relatively long duration are achieved.

SUMMARY OF THE INVENTION

In carrying out the invention there is provided a printed circuit interconnect board comprising a dielectric layer, one series of holes performed in said dielectric layer, said holes being at predetermined points at which resistance weld-through interconnections are to be made, a first series of metallic strip conductors bonded to one side of said dielectric layer, a second series of metallic strip conductors bonded to the other side of said dielectric layer, resistance welds between said first and said second metallic strips at a predetermined number of said series of holes, and lead tabs resistance welded to said resistance welds at one side of said board.

In carrying out the invention according to another form there is provided a method of making a printed circuit interconnect board comprising in combination the steps of providing first and second resistance weldable metallic film layers, providing a dielectric layer impregnated with a thermosetting adhesive, preforming, as by prepunching, a series of holes in said dielectric at points wherein weld-through connections are to be made, disposing said first and second metallic film layers on opposite sides of said dielectric layer, resistance welding said first metallic film layer to said second metallic film layer through said series of openings in said dielectric layer to form a sandwhich, applying temperature and pressure for a predetermined time to said sandwhich to cure the impregnated adhesive in said dielectric layer for laminating said first and said second metallic film layers to said dielectric layer, masking, as by photoresisting, and etching both sides of said laminate according to a predetermined pattern to form conducting metallic strips on both sides of said dielectric layer, forming component lead holes in the dielectric layer of the sandwich adjacent said series of holes, and resistance welding lead tabs to a predetermined number of points where said first and said second metallic layers were resistance welded through said preformed holes.

BRIEF DESCRIPTION OF THE DRAWINGS

For a more complete understanding of the invention, reference should be had to the accompanying drawings in which

FIG. 9 is a top plan view of an article according to the invention at a later stage of its manufacture;

FIG. 10 is a sectional view taken substantially in the direction of the arrows 10—10 of FIG. 9;

FIG. 11 is a sectional view taken substantially in the direction of the arrows 11—11 of FIG. 9;

FIG. 12 is a sectional view taken substantially in the direction of the arrows 12—12 of FIG. 9;

FIG. 13 is a sectional view similar to FIG. 12 at a later stage in the manufacture of an article according to the invention;

FIG. 14 is a sectional view similar to FIG. 13 of a modified form of an article according to the invention;

DESCRIPTION OF THE PREFERRED EMBODIMENTS

A basic component of the invention is a doublesided metallic printed circuit board in which the two metal sides are welded together by electrical resistance welding through holes in a separating dielectric layer with lead tabs electrically resistance welded to one of the metal sides at the points where the two metal sides are welded together. Additional openings or holes are formed through the dielectric of the metal-dielectric-metal sandwich adjacent to point where the two metal sides are welded through. Leads of components to be mounted on the board may be disposed through the additional openings in the proximity of the lead tabs, and the lead tabs and the leads of the components are resistance welded together. In this manner an all resistance welded and weldable printed circuit board is formed with resultant high reliability, and strong connections which are resistant to fatigue. Thereby long use life is achieved, damaging of circuit boards during manufacturing is greatly lessened, if not completely eliminated, because the heat for attaching lead tabs to the boards and the heat for attaching component leads to the lead tabs is localized and of very short duration by resistance welding. The heat is not transmitted to the other components on the circuit board or to the circuit board itself.

In this way, as compared with lead-tin soldering operations, substantial advantages are achieved. In the lead-tin soldering operation, fluxes are needed which tend to contaminate the connections as well as the circuit board thereby requiring expensive cleaning-up operations, and the contamination of the board may make it unusable. Similarly, the heat which is necessary to achieve soldering may damage the components or the board beyond usability.

Figure 6:
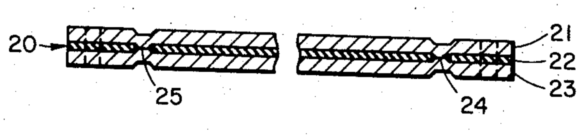
FIG. 6 is a sectional view similar to FIG. 5 at a still later stage of carrying out the invention.

A basic component of structure according to the invention, at one stage of its construction, is illustrated by the sectional view of FIG. 6. In this view there is shown a sandwich 20 consisting of a thin layer of metal 21, a dielectric insulating layer 22 bonded to one side of the metal layer 21, and a second thin metal layer 23 bonded to the other side of the dielectric layer 22, the metal layers being coextensive with the dielectric.

In the structure of FIG. 6 the metallic film layers 21 and 23 may, for example, be made of nickel of the order of 0.004 – 0.005 inch in thickness, and the dielectric layer 22 in the cured state, that is, after bonding, may be of the order of 0.0015 – 0.002 inch in thickness. Prior to curing of the dielectric material, it may be of the order of 0.003-inch thickness and may be visualized in its thicker form in FIG. 5. One form of suitable dielectric material is fiberglass impregnated with stage B epoxy resin which is available from regular commercial sources designated in the indicated manner. This would not preclude using a thin, non-reinforced film such as 0.001 polyimide (KAPTON) with 0.001 B stage thermosetting adhesive other than epoxy resin on each side. In addition, in the showing of FIG. 6, the metal film sheets 21 and 23 are shown electrically resistance welded together at points 24 and 25 through holes 26 (FIG. 4) which have been prepunched or otherwise formed in the dielectric layer 22 at an earlier state in the process. If desired, in place of nickel as a material for the layers 21 and 22, Kovar brand alloy may be used. Kovar brand alloy is readily welded by electrical resistance welding as is nickel.

Figure 2:
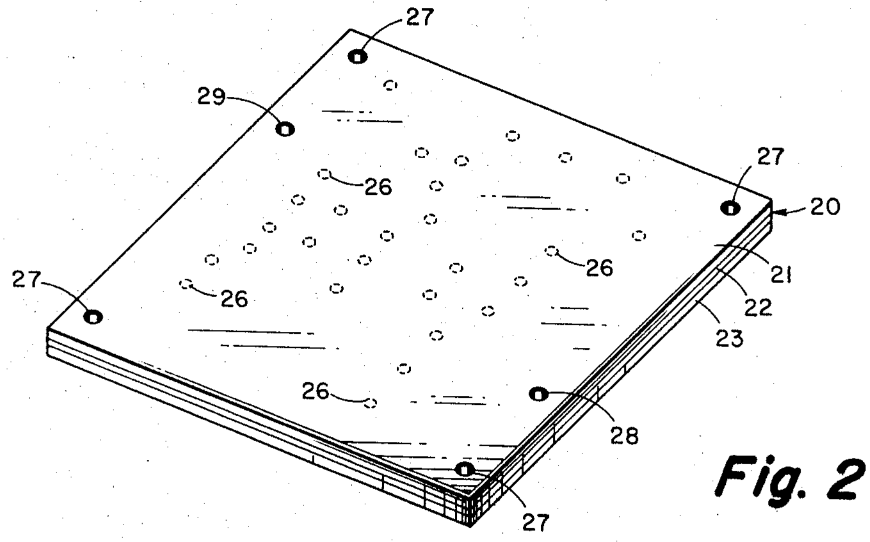
FIG. 2 is a perspective view of the components shown in FIG. 1 at a later stage of carrying out the invention.

Referring to FIG. 2, the sandwich 20 of FIG. 6 is shown prior to the bonding or curing step. The sandwich is shown in plan view in perspective with the metallic film layer 21 on top. The holes 26 are shown as dotted circles and exist only in the dielectric layer 22. The surfaces of the metal films 21 and 23 do not have any holes therethrough corresponding to the holes 26.

Holes 27 are shown at each of the corners of the sandwich in FIG. 2 and additional holes 28 are shown along two of the sides of the sandwich for locating the metal film layers 21 and 23, and the dielectric layer 22 relative to each other at all stages of the process where this may be necessary.

Figure 1:
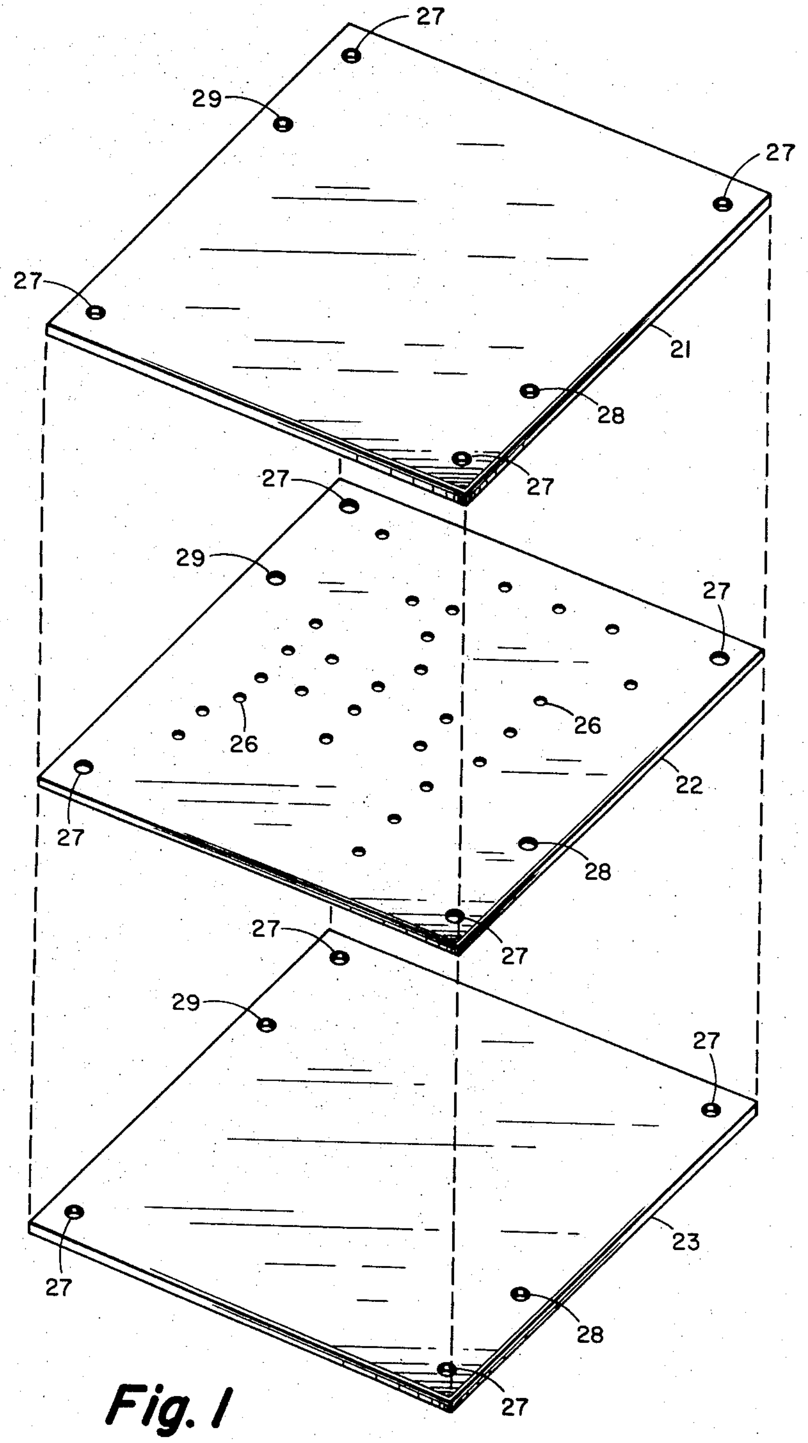
FIG. 1 is a diagrammatic exploded view in perspective illustrating one step in carrying out the invention.

In FIG. 1, to which reference is now made, the metallic layers 21 and 23 with the insulating dielectric layer 22 between them are shown is exploded perspective view. The corner locating holes 27 in each of the layers 21, 22, and 23 are shown directly above each other as are the locating holes 28 and 29 in each of the members. As has been indicated, the dielectric layer 22, according to a preferred form of the invention, may consist of fiberglass pregnated with stage B epoxy resin, and it has the holes 26 prepunched therein according to a predetermined plan which conforms to the desired location of metallic film strip circuits on the surface of the dielectric layer 22 as may be visualized by referring briefly to FIGS. 7, 8 and 9. While it is stated that the holes 26 are prepunched, they may be formed in other ways as by drilling, but in any event, the holes are formed as by prepunching prior to the subsequent steps in the present assembly.

Referring to FIG. 2, the thin metal layers 21 and 23, and the dielectric layer 22, have been moved to lie against each other in sandwich form as shown.

Figure 3:
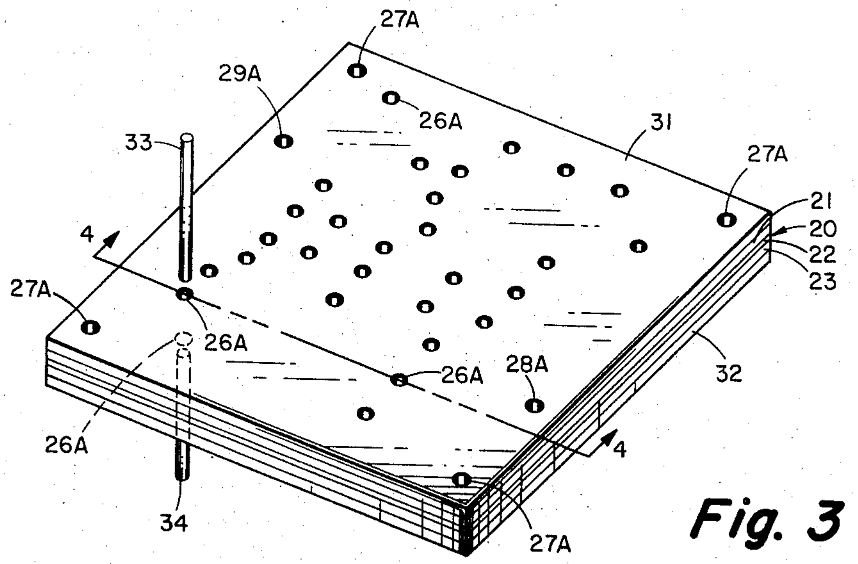
FIG. 3 is a perspective view similar to FIG. 2 at a still later stage of carrying out the invention.

In FIG. 3 the sandwich 20 of layers 21, 22 and 23 is shown assembled together with two templates 31 and 32, respectively, on top and bottom of the sandwich. The templates 31 and 32 have locating holes 27A at the corners thereof which correspond in position to the locating holes 27 of the sandwhich and in addition the templates have locating holes 28A and 29A also corresponding in location to the locating holes 28 and 29 of the layers of the sandwich. In addition the templates include holes 26A disposed in the same location as the holes 26 in the dielectric layer 22.

Figure 4:
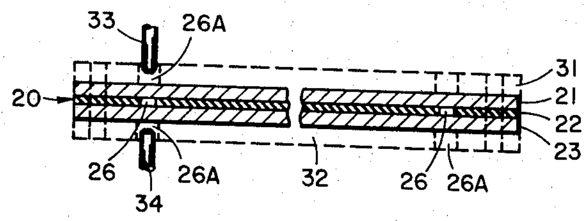
FIG. 4 is a sectional view taken substantially in the direction of the arrows 4—4 of FIG. 3.

The holes 26A in the templates 31 and 32 are directly above and below the holes 26 as may be seen best in FIG. 4 in which the layers 21, 22 and 23 of the sandwich 20 and the templates 31 and 32 are shown in sectional view. The holes 26A in the templates 31 and 32 are sized so as to easily receive two electric welding electrodes 33 and 34, respectively, as seen in FIGS. 3 and 4.

The welding electrodes 23 and 24 are brought together while the templates 31 and 32 are held next to the sandwich of layers 21, 22 and 23. Electrical current is applied through the welding electrodes 33 and 34, as is well understood, and resistance welds are formed at the holes 26 in the dielectric layer 22, the welds being indicated by the reference characters 24 and 25 in FIGS. 5 and 6. Locating pins may be disposed through the holes 27, 27A, 28, 28A, 29 and 29A, and the pieces may be clamped together if necessary, by means not shown. The welding electrodes 33 and 34 may be applied to the metal film layers 21 and 22 through each of the holes 26A in the templates. If desired a group of electrodes 33 and 34 may be formed and held in an appropriate holder so that all of the welds may be formed at one time. But in any event the thin metal layers 21 and 22 are deformed by the resistance welding to form, in effect, small dimples where the portions of the metal layers are forced into the holes 26 in the dielectric layer to bring the metal layers together.

Figure 5:
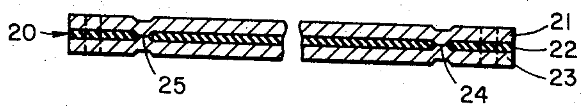
FIG. 5 is a sectional view similar to FIG. 4 at a later stage of carrying out the invention.

After all of the welds through holes 26 have been formed by the electrodes 33 and 34, the electrodes as well as the templates 31 and 32 are removed thereby giving the sandwich 20 as it appears in FIG. 5. The metal layers 21 and 23 are held together by the welds 24 and 25 formed at each hole 26 in the dielectric layer, but there has been no compression of or curing of the B stage epoxy resin which impregnates the dielectric layer 22. The welds through 24 and 25, however, holds the metal film layers 21 and 23, and the dielectric layer 22, firmly and accurately together.

After the sandwich has been formed as illustrated in FIG. 5 and described in connection therewith and the preceding figures, the sandwich is placed in a curing press (not shown) but which may be of any well known form for the indicated purpose. The curing press applies pressure to the full extent of each of the metal film layers 21 and 23, the pressure being of the order of 200 pounds per square inch. The temperature being applied is of the order of 350°F, and the sandwich is allowed to remain in the curing press under these conditions for a period of about 1 hour. These conditions are exemplary only and other conditions may, of course, be devised by those skilled in this art. During the curing process the stage B epoxy resin becomes fully cured and as is well known becomes essentially liquid during this state. It therefore flows around the metal of the welds 24 and 25, thereby sealing the weld joints off from any subsequent exposure to etching solutions and the like. Also during the curing process the thickness of the dielectric layer 22 becomes thinner as has already been described whereby when the curing process is completed, the metal dielectric metal sandwich is as shown in FIG. 6.

At an earlier stage in the process, photographic mask or the like has been constructed which locate each of the holes 26 in the dielectric layer 22 and correspondingly, of course, the location of the weld-through joints between the metallic film layers 21 and 23. Two photographic masks (not shown) are needed, one for the top surface of the metal film layer 21, and one for the bottom surface thereof. Each of these masks has been designed, as is well known, to delineate the metal circuits which are desired to be left upon the supporting insulating or dielectric 22 when the etching process is complete.

Figure 7:
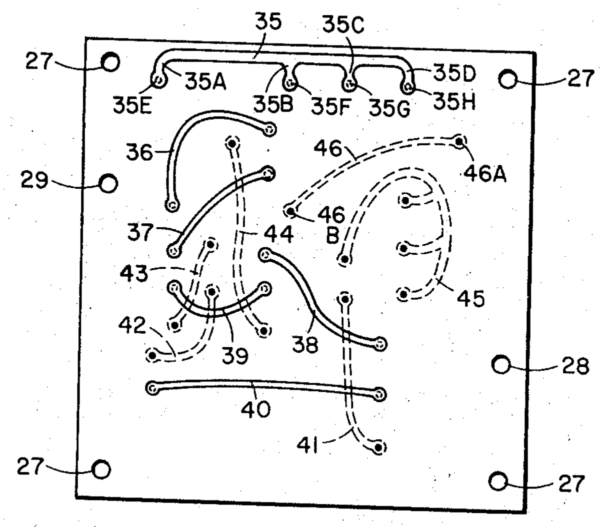
FIG. 7 is a plan view of an article according to the invention at one stage of its manufacture.

Thus, referring to FIG. 7, the metal film strips, or connection circuits 35, 36, 37, 38, 39 and 40, are intended to remain on the top surface of dielectric layer 22. On the other hand, the metal film strips or connection circuits 41, 42, 43, 44, 45 and 46 intended to remain on the bottom surface of dielectric layer 22 as may be seen in FIG. 8. The photographic masks (not shown) are formed as is well understood in this art and are applied to the outer surfaces of metal film layers 21 and 23, and by means thereof and other photoresist techniques, a photoresist pattern is formed on the outer surfaces of the metal film layers 21 and 23. The photoresist patterns, of course, outline the metal film strips 35 – 40 inclusive on one side of the sandwich and the metal film strips 41 – 46 on the other side of the sandwich.

Figure 8:
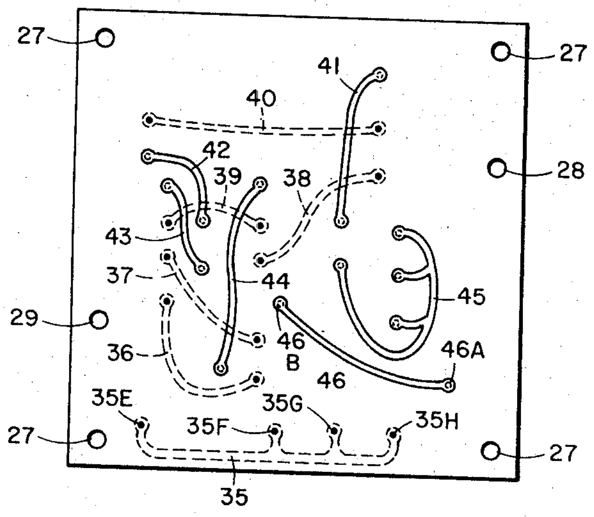
FIG. 8 is a bottom plan view of the article shown in FIG. 7.

After the formation of the photoresist patterns of the conductor strips on each side of the sandwich which include, of course, the area around each hole 26 where a resistance weld has taken place, the sandwich is subjected to an etching solution which, for example, may be ferric chloride. Other etching solutions will be known to those skilled in this art depending upon whether nickel, the alloy Kovar, or some other weldable material is used. The sandwich 20 is permitted to remain in the etching solution until all of the metal, nickel, for example, has been removed except that which is protected by the photoresist pattern, which is to say, the conducting strips 35 – 40 on the top side of the dielectric layer and the conducting strips 41 – 46 on the bottom side of the dielectric layer 22. After the etching process is complete, the top surface of the sandwich will look as seen in FIG. 7 and the bottom surface will look as seen in FIG. 8.

Each weld-through connection associated with a metal strip conductor on one side of the dielectric layer 22 appears as a pad of residual metal on the opposite side of the dielectric layer 22. Two examples will suffice to illustrate this point, one for each side of the dielectric layer. Conducting metal strip 35 appears as a strip on the top side of dielectric layer 22 and has extending therefrom fingers 35A, 35B, 35C and 35D at the end of which there is a weld-through connection 35E, 35F, 35G and 35H, respectively. The weld-through connections 35E, 35F, 35G and 35H appear as the solid dots or pads carrying the same reference characters in FIG. 8. The metal conducting strip 46 is bonded to the bottom side of the dielectric layer 22 and has weld-through connections 46A and 46B at its end respectively. Thus on the upper side (FIG. 7) of the dielectric layer 22, the weld-through connections 46A and 46B appear as solid pads of metal. Similarly for the other circuits on top and bottom respectively of the dielectric layer 22 and it is believed that this will be clear without further specific designation of the weld-through connections. The number of metal film circuits on top of the dielectric layer 22 and the number thereof on the bottom of dielectric layer 22 is, of course, limited only by the amount of space and the width of the conducting strips desired. Those shown in FIGS. 7 and 8 are by way of example to illustrate the principal involved.

The photoresist masks utilized for forming the pattern of the conductors and the weld-through connections on the top surface of dielectric layer 22 (FIG. 7) will, of course, include the metal film strips as well as the pads of metal for weld-through connections from the metal film strips on the bottom of the dielectric layer.

Similarly, the photographic mask for forming the pattern of the conductors and the weld-through connections on the bottom of dielectric layer 22 (FIG. 8) will include the pattern for the conducting strips on the bottom of the dielectric layer as well as the pattern for the weld-through connection (pads of metal) from the conducting metal strips on top of the layer. This is well understood in the art and such photoresist masks are not believed necessary to be shown. The masks will, of course, include locating holes 27, 28 and 29 so that the same masks may be used whenever it is desired to locate the metal strip conductors and the weld-through connections.

Referring to FIG. 9, the next stage of formation of the article according to the invention and the way of carrying out the method are shown. The patterns of the metallic strip conductors on the top and bottom surfaces of the dielectric layer 22 are shown the same as in FIG. 7. In addition, adjacent each weld-through connection, there is now provided an additional hole through the dielectric layer 22 through which the leads of components to be attached are subsequently fed. Thus referring to conducting strip 35 and the feedthrough weld connections 35E, 35F, 35G and 35H, by way of examples, there are formed holes 47, 48, 49 and 51. The holes 47 – 49 and 51 may be formed in any manner such as by punching, for example, or drilling if desired.

FIG. 10 illustrates a sectional view taken along the metal strip conductor 40 on top of the dielectric layer 22. At the right-hand end of conductor 40 there is a weld-through connection 52 as described for other weld-through connections which include a pad of metal material 53 on the bottom surface of dielectric layer 22. A hole 54 has been formed as by punching through the dielectric layer 22 adjacent the weld-through connection 52. At the left-hand end of the metal strip conductor 40, there is a weld-through connection 55 and a hole 56 through the dielectric layer 22.

FIG. 11 illustrates a sectional view through the lower end of conductor 41 on the bottom surface of the dielectric layer 22. A weld-through connection 57 including a pad of metal material 58 on top of the dielectric layer 22 are shown and alongside it there is a hole 59 through the dielectric layer 22.

FIG. 12 illustrates a section view which includes one end of conductor 39 on top of the dielectric layer 22, and one end of conductor 43 on the bottom of the dielectric layer 22. At the end of conductor 39 there is a weld-through connection 63 and a pad of metal 64 on top of the dielectric layer 22. Adjacent each of the weld-through connections 61 and 63, there are holes 65 and 66, respectively, through the dielectric layer 22.

While three sectional views have been shown in FIGS. 10, 11 and 12 to illustrate three possible combinations of conductors on top and bottom of the dielectric layer 22 together with their weld-through connections and the additional holes through the dielectric layer 22, these figures are exemplary, and it will be understood that each of the weld-through connections as shown in FIG. 9 will include an adjacent hole through the dielectric layer 22 for the purpose indicated. It will also be clear in considering FIGS. 10, 11 and 12 that the flow, during the curing process, of the stage B epoxy resin with which the fiberglass layer 22 is impregnated, around the weld-through connections, in effect, seals off the welds from the etchant solution. Such seals protect the welds from deterioration.

FIG. 13 is a sectional view similar to FIG. 12 in its inclusion of the dielectric layer 22 and the portions of the conductors and weld-through connections. In addition there is shown a lead tab 67 which has a flange 68 welded to the pad of metal 62 and thus to the end of conducting strip 39. The welding is done by means of the weld electrodes 69 and 71 angularly disposed as shown. The web portion 70 of the lead tab extends at right angles to the flange 68. Another lead tab has a flange 72 and a web portion 73. The flange 72 is electrically resistance welded to the pad of metal 43 forming part of a weld-through connection 63. The web 73 extends at right angles to the flange 72. The weld of flange 72 is performed by the electrodes 69 and 71.

While only two lead tabs 67 and 72, 73 are shown in FIG. 13, it will be understood that lead tabs are similarly attached on the same side of the dielectric layer 22 to all of the weld-through connection points to which it is desired to connect an external component.

An electrical component such, for example, as a capacitor or resistor 74 has leads 75 and 76, for example, extending from its ends and bent at right angles thereto so that these leads can project through the holes 65 and 66 to bring the leads alongside the webs 70 and 73, respectively, as seen in FIG. 13. Electrical resistance welding electrodes which may be the same electrodes 69 and 71, but shown in the attitude of FIG. 14 are then brought to bear against the end of the web 70 and the end of the leads 75 and a resistance weld connection 77 formed thereat as is well understood. Similarly an electrical resistance weld 78 is formed at the outer end of web 73 and the end of lead 76. The webs 67 and 73 are of sufficient length, and the leads 75 and 76 likewise are of sufficient length so that approximately three or four weld leads could be made between the outer ends of the webs 70 and 73, and the flanges 68 and 72. Since the welds are made at the outer ends as indicated, if it is desired to remove the component 74, it is necessary only to snip or otherwise cut the welded portion of the web and lead end off and remove the component. A new component will have leads similar to 75 and 76 which are then disposed through holes 65 and 66, and a new weld will be formed at the new extremity of the webs 70 and 73, respectively. This may be carried out until there is no length left of webs 70 and 73. In the foregoing manner, it will be readily understood that there is provided an all-welded printed circuit board and components which is easily and completely repairable for several instances of repair at the same location without impairing the circuit board in any way.

In FIG. 14 the same arrangement of components, or parts, as in FIG. 13 is shown except that the weld electrodes 69 and 71 are disposed at right angles to the position in FIG. 13 whereby the welds 77 and 78 may be formed between the flanges of the lead tabs and the adjacent leads of component 74. In addition, the dielectric layer 22 of FIG. 13 has a protective or insulating layer 29 bonded thereto. Of course, it will be understood that the protective layer 79 will be bonded to the dielectric layer 22 before the component 74 is attached to the assembled circuit board.

The protective insulating layer 79 may be fiberglass impregnated with stage B expoxy resin similar to the dielectric layer 22. Likewise the protective layer 79 has holes 81 and 82 formed as by prepunching at the locations shown in FIG. 14 in order to accommodate the ends of metal 39 and 64 which are portions of the weld-through resistance connections formed as already described. For forming the holes 81 and 82 at the proper location, the same photoresist mask as was used for the dielectric layer 22 in the first instance or a similar template is used for locating and marking the holes 81 and 82. It will be understood that holes 81 and 82 appear at all points over the surface of the layer 79 in order to conform to the location of weld-through connections at all points over the surface of dielectric layer 22.

After all of the holes 81 and 82 are formed, as by prepunching, in protective layer 79, the protective layer 79 is disposed against the already-cured dielectric layer 22 in the proper position determined by the locating holes 27, 28 and 29 (not shown in FIG. 14). These holes exist as already described in dielectric layer 22 and exist at the same respective points in protective layer 79. At this stage the lead tabs 67 and 73, 72 have not yet been attached to the circuit board nor has the component 74 been attached either. Also the holes 65 and 66 have not been formed in dielectric layer 22. The already cured dielectric layer 22 and the uncured layer 79 are now placed in the curing press, and the same temperature and pressure are applied for this same length of time as previously indicated thereby bonding the protective layer 79 to the dielectric layer 22 and leaving the pads of metal 39 and 64 exposed in the holes 81 and 82. The layer 79 is shown thicker than the layer 22, but this may not be necessary unless desired.

After the layer 79 has been bonded to the dielectric layer 22, lead holes 83 and 84 and lead holes 65 and 66 are formed at the same time over the whole surface of the layer 79 utilizing the same photoresist mask or template, as previously which as stated has the location of the holes that are needed disposed thereon. The holes 83, 84 and 65, 66 may be formed by punching, drilling or the like. The holes 83 and 84 are, of course, alongside the holes 81 and 82, respectively, and conform to the precise location of the required location of holes 65 and 66 in the dielectric layer 22. At this stage the flanges 68 and 72 of the weld tabs are welded to the pads of metal 62 and 43 of the resistance welded weld-through connections 61 and 63 as described. The latter step is followed by the disposition of the component 74 with its leads 75 and 76 projecting through the aligned openings 83, 65 and 84, 66. This step is followed by welding the lead 75 to the web 70 and welding the lead 76 to the web 73 as already described.

While only one component 74 has been shown in FIGS. 13 and 14, it will be understood that there may be as many components as are desired attached to the board in the same manner. Interconnections between boards may be made in the same manner also if desired.

The invention is not confined to the formation of three-layer sandwiches as is described in connection with FIGS. 1 - 13, for example, in which the sandwich consists of metal-dielectric-metal. Also, the sandwich of FIG. 14 which includes the metal-dielectric-metal portion with an additional protective insulating coating is not restrictive of the invention.

Figure 15:
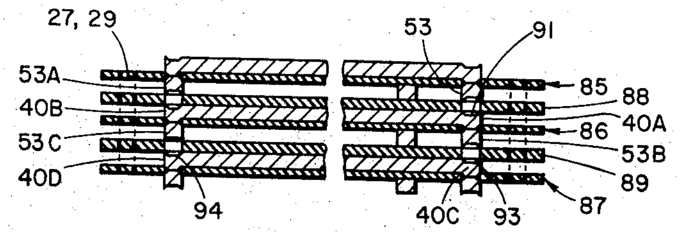
FIG. 15 is a sectional view of a further form of the invention.

In FIG. 15 there is shown a multilayer sandwich or welded interconnection board in which three typical layers or sandwiches as shown in FIG. 10 have been disposed next to each other and would be bonded together to form one integrated structure without the gaps shown between the various components as will be understood. In FIG. 15 there are three-layer sandwiches 85, 86 and 87 separated from each other by dielectric layers 88 and 89. In forming this structure, two sandwiches 85 and 86 identical to that shown in FIG. 10 and formed in the same manner are disposed adjacent to each other with a dielectric layer 88 therebetween. It will be understood that the sandwiches 85 and 86 have been completely cured as already described. The dielectric layer 88, however, as shown in FIG. 15 is not cured and consists of the same fiberglass material impregnated with stage B epoxy resin as described for the dielectric layer 22. The dielectric layer 88 has holes 91 and 92 formed therein through the use of the same locating, or template, mask as previously described, these holes 91 and 92, for example, being shown to conform to the pads of metal 53 and 53A of the sandwich 85, also FIG. 10. The holes 91 and 92 are necessary for the metal of pads 53 and 53A to come into contact with the metal pads 40A and 40B of metal strip 40 of sandwich 86, also FIG. 10.

After the sandwiches 85 and 86 have been disposed next to each other with the impregnated dielectric of insulating layer 88 in between, the three layers 85, 88 and 86 are maintained in their desired locations precisely by means of the same locating holes 27, 28 and

29 which exist in all of these layers. Thereafter, the assembled layers 85, 88 and 86 are welded together at the pads of metal 53 and 40A through the hole 91 and at the pads of metal 53A and 40B through the hole 92. Thus, weld-through connections are formed at the same points as exist in a sandwich according to FIG. 10 but now exist in the sandwich consisting of sandwiches 85 and 86 separated by the dielectric layer 88. Following the resistance welding step the two sandwich component is disposed in the curing press and the same conditions of pressure and temperature are applied for the same length of time as previously described. This forms a sandwich consisting of layers 85, 88 and 86 with the dielectric material layer 88 now bonded at all points. If desired at this stage, additional holes such as 65 and 66 described in connection with FIGS. 12, 13 and 14 may be formed and lead tabs welded at the appropriate weld-through connections as already described. In that event a printed circuit interconnect board consisting of four layers of metal and three layers of insulating material is provided.

If a three sandwich circuit board construction is desired the third sandwich 87 formed as described is disposed adjacent the assembly including sandwiches 85, 88 and 86 with another dielectric or insulating layer 89 in between. The impregnated dielectric layer 89 has holes 93 and 94 formed therein at the precisely desired locations by utilizing a mask or template the same as the mask template already described. The layer 89 and the sandwich 87 are then held adjacent the sandwich 86 by means of the same locating holes 27, 28 and 29 also as described. The assembled components 85, 88, 86, 89 and 87 are now placed in an electric resistance welding machine and welds formed between the pads of metal 40C and 53B through the hole 93, and between the pads of metal 53C and 40D through the hole 94. Holes 93, 94 it will be understood exist over the whole surface of the dielectric layer 89 and through welds are made at each hole. Following the latter welding steps, the assembled components are again disposed in the curing press and the same conditions of pressure and temperature are applied for the same length of time in order to bond the resin impregnated dielectric layer 89 to the dielectric layer 22 of sandwiches 86 and 87. Thereafter, holes corresponding to holes 65 and 66 are FIGS. 12, 13 and 14 may be drilled or punched into the laminated triple sandwich in order that components may be attached thereto through the use of welding tabs which have previously been welded to the appropriate places, as described.

Figure 16:
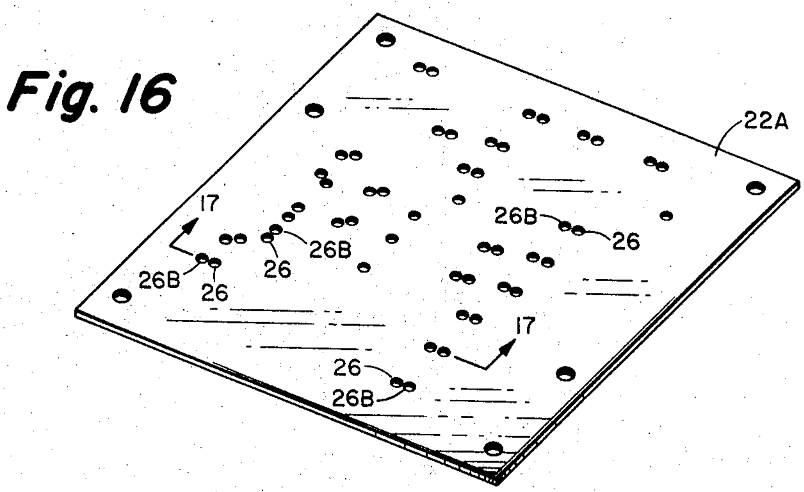
FIG. 16 is a top plan view of a modified form of dielectric layer according to the invention.

In the preceding examples the dielectric layer 22 has been fiberglass impregnated with stage B epoxy resin which is of the flow type in order that the resin, during the curing process, will flow around the previously formed weld-through joints, or connections thereby sealing off the weld joints from the action of the etching agent when the circuit strips are formed. In order to have holes for the insertion of component leads, it was then necessary that the additional holes be drilled or punched after the curing operation. This is the preferred form of the invention but it is not essential. In those instances where conditions permit of it, the dielectric layer 22A as shown in FIG. 16 may have two holes formed at each location instead of only one. The holes may be designated 26 and 26B in order to conform to the showing in FIG. 1 and other related Figures. The holes 26 and 26B would of course be preformed as by prepunching.

Figure 17:
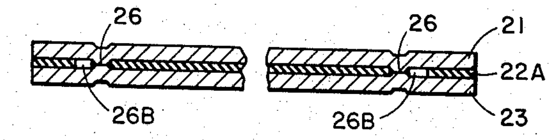
FIG. 17 is a sectional view of a modified form of article according to the invention utilizing the dielectric layer illustrated in FIG. 16.

In this instance, however, the impregnation of the dielectric layer 22 would be with a stage B epoxy resin of the no flow variety. Thus, when the layer 22A assembled with metallic layers 21 and 23 on its respective sides is placed in a welding machine and weld-through connections formed at holes 26 as shown in FIG. 17, the holes 26B are disposed alongside as shown in FIG. 17. After forming the weld-through connections at holes 26, the assembled sandwich of FIG. 17 is placed in a curing press and the same or similar conditions of temperature and pressure are applied for the same or similar length of time in order to bond the metallic layers 21 and 23 to the dielectric layer 22A. Since the impregnating epoxy resin is of the stage B no flow variety, there is no flow of the resin during the curing stage and the holes 26B remain as holes as indicated in FIG. 17.

That is to say there is no flow of the resinous material into the holes 26B and the holes remain as such. After the curing process, the assembly, as shown in FIG. 17, is treated in the same manner as in connection with the elements of FIGS. 1 through 14. Photoresist mask and other printed circuit techniques are applied to the metallic layers 21 and 23 to delineate the circuit strips desired and thereafter the sandwich is placed in an etching solution such as ferric chloride to demark the strip circuits as shown in FIGS. 7 and 8. When this is done, the holes 26B are exposed and a structure, in effect, indentical with that shown in FIGS. 10, 11 and 12 is achieved. In this case, however, the etching solution such as ferric chloride has an opportunity to come into contact with the material of the weld as the weld-through connections at 26 and for this reason precautions must be taken to be certain that the weld material is not attacked by the etching solution beyond that which can be tolerated. Likewise, cleaning steps to remove all traces of the etching material must be taken in order that the resulting board be completely satisfactory.

What is claimed is:

1. The method of making a printed circuit interconnect board comprising in combination the steps of:

- providing first and second resistance weldable metallic film layers;
- providing a dielectric layer impregnated with a thermosetting adhesive;
- preforming a series of holes in said dielectric at points wherein weld-through connections are to be made;
- disposing said first and second metallic film layers on opposite sides of said dielectric layer;
- resistance welding said first metallic film layer to said second metallic film layer to form said weld-through connections in said series of holes in said dielectric layer to form a sandwich;
- subsequently applying temperature and pressure for a predetermined time to said sandwich causing said thermosetting adhesive to flow into and fill said holes in said dielectric layer and surround said weld-through connections within said holes and to cure the impregnated adhesive in said dielectric layer for laminating said first and said second metallic film layers to said dielectric layer; and
- masking and etching both sides of said laminate according to a predetermined pattern to form conducting metallic strips on both sides of said dielectric layer.

2. The method according to claim 1 wherein said masking is photoresisting.

3. The method according to claim 1 wherein the preforming of holes in the dielectric layer is by prepunching.

4. The method according to claim 1 wherein the metallic film comprises nickel.

5. The method according to claim 1 wherein the metallic film comprises the alloy Kovar.

6. The method according to claim 1 including, at one side of said sandwich, the step of resistance welding lead tabs to a predetermined number of points where said first and said second metallic layers were resistance welded through said preformed holes.

7. The method according to claim 6 including the step of forming component lead holes in the dielectric layer of the sandwich adjacent the welded lead tabs.

8. The method according to claim 7 including the steps of providing components having leads; disposing said components on the side of said sandwich opposite to said tabs; projecting the leads of said components through respective ones of said lead holes and resistance welding said leads to respective ones of said lead tabs.

9. The method according to claim 1 wherein the dielectric layer impregnated with a thermosetting adhesive comprises fiberglass cloth impregnated with thermosetting resin.

10. The method according to claim 9 wherein the thermosetting resin comprises a stage B epoxy.

11. The method of making a printed circuit interconnect board comprising in combination the steps of:

- providing first and second resistance weldable metallic film layers;
- providing a first dielectric layer impregnated with a thermosetting adhesive;
- preforming a first series of holes in said first dielectric layer at points wherein weld-through connections are to be made;
- disposing said first and second metallic film layers on opposite sides of said dielectric layer;
- resistance welding said first metallic film layer to said second metallic film layer to form said weld-through connections in said first series of holes in said dielectric layer to form a sandwich;
- subsequently applying temperature and pressure for a predetermined time to said sandiwch causing said thermosetting adhesive to flow into and fill said first series of holes in said first dielectric layer and surround said weld-through connections within said first series of holes and to cure the impregnated adhesive in said first dielectric layer for laminating said first and said second metallic film layers to said first dielectric layer;
- masking and etching both sides of said laminate according to a predetermined pattern to form conducting metallic strips on both sides of said first dielectric layer;
- providing a second dielectric layer impregnated with a thermosetting adhesive;
- preforming a series of holes in said second dielectric layer at the same locations as those of said first series of holes in said first dielectric layer;

disposing said second dielectric layer against one side of said sandwich with said first series of holes in registry with said second series of holes; and applying temperature and pressure for a predetermined time to the assembly of said sandwich and said second dielectric layer to cure the impregnated adhesive in said second dielectric layer for laminating said sandwich and second dielectric layer to each other.

12. The method according to claim 11 wherein said masking is photoresisting.

13. The method according to claim 12 including the steps of:

forming a third series of holes in said laminated sandwich and second dielectric layer adjacent said second series of holes in said second dielectric layer; and resistance welding lead tabs to a predetermined number of points where said first and said second metallic layers were resistance welded through said first preformed holes on the side of said sandwich opposite to said second dielectric layer and utilizing said second series of holes in said second dielectric layer.

14. The method according to claim 13 wherein the preforming of said first and second series of holes is by prepunching.

15. The method according to claim 14 wherein the forming of said third series of holes is by drilling.

16. The method according to claim 15 wherein the thermosetting adhesive impregnated in said first and said second dielectric layers comprise a stage B epoxy resin.

17. The method according to claim 16 including the steps of providing components having leads; disposing said components on the same side of the assembly as said second dielectric layer; projecting the leads of said components through respective ones of said third series of holes into the vicinity of respective ones of said lead tabs; and resistance welding respective ones of said component leads and said lead tabs to each other adjacent the outer end of said lead tabs.

18. The method according to claim 17 wherein the metallic film comprises nickel.

19. The method according to claim 17 wherein the metallic film comprises the alloy Kovar.

* * * * *